United States Patent
Lin et al.

(10) Patent No.: US 8,523,161 B2
(45) Date of Patent: Sep. 3, 2013

(54) CLAMPING MECHANISM AUTOMATICALLY ADAPTABLE TO CHANGE OF THICKNESS OF PRINTED CIRCUIT BOARD

(75) Inventors: Cheng-Feng Lin, Taichung (TW); Chi-Tai Liu, Taichung (TW)

(73) Assignee: Hiwin Mikrosystem Corp., Taichung (TW)

( * ) Notice: Subject to any disclaimer, the term of this patent is extended or adjusted under 35 U.S.C. 154(b) by 556 days.

(21) Appl. No.: 12/850,973

(22) Filed: Aug. 5, 2010

(65) Prior Publication Data

US 2012/0032384 A1 Feb. 9, 2012

(51) Int. Cl.
*B23Q 3/06* (2006.01)
(52) U.S. Cl.
USPC .............................................. 269/151; 269/93
(58) Field of Classification Search
USPC ................. 269/151, 138, 136, 109, 111, 112, 269/291, 86, 152, 315–320
See application file for complete search history.

(56) References Cited

U.S. PATENT DOCUMENTS 4,635,911 A * 1/1987 Lovrenich ...................... 269/93

* cited by examiner

*Primary Examiner* — Monica Carter
*Assistant Examiner* — Melanie Alexander
(74) *Attorney, Agent, or Firm* — Guice Patents PLLC

(57) ABSTRACT

A clamping mechanism automatically adaptable to change of thickness of printed circuit board includes: a frame body having two parallel rail seats; two clamping rail members respectively mounted on the rail seats for clamping a printed circuit board, each clamping rail member including a first clamping rail and a second clamping rail spaced from each other by a clamping gap; and two adjustment units for adjusting the clamping gap of the clamping rail members. Each the adjustment unit includes: a support section mounted on the frame body to provide a support face; a connection section, one end of the connection section being affixed to the first clamping rail, the other end of the connection section being positioned above the support face; and a floating section positioned between the connection section and the support section and supported on the support face to apply a resilient support force to the connection section.

9 Claims, 6 Drawing Sheets

CLAMPING MECHANISM AUTOMATICALLY ADAPTABLE TO CHANGE OF THICKNESS OF PRINTED CIRCUIT BOARD

BACKGROUND OF THE INVENTION

1. Field of the Invention

The present invention relates generally to printed circuit board (PCB) manufacturing and processing technique, and more particularly to a clamping mechanism automatically adaptable to change of thickness of printed circuit board.

2. Description of the Related Art

A printed circuit board has a substrate made of such as glass epoxy material. Predetermined circuits are formed on the substrate by means of the conventional transfer printing and etching techniques. Then proper electronic components are electrically connected to the printed circuit board to serve as a part of an electronic equipment. All kinds of electronic equipments have become more and more complicated over the years. As a result, multilayer PCB substrate made of up to 100 layers by lamination has been developed instead of the traditional single-layer substrate. No matter how many layers the PCB substrate has, in the manufacturing process of the PCB, the PCB must be tested by means of optical scanning or flying probe tester to ensure that the PCB is free from short-circuit or breakage and thus ensure good quality of the product.

In the automated manufacturing process of the printed circuit board, a conveyor 1 is used to horizontally move the printed circuit board as shown in FIG. 1. The conveyor 1 has two parallel clamping rail members 2 for clamping two sides of the printed circuit board. The conveyor 1 further has a transmission mechanism 3 for linearly moving the printed circuit board, which is held between the clamping rail members 2. Under such circumstance, the printed circuit board can be stably horizontally moved in the manufacturing or processing process for, such as the test.

However, as aforesaid, the thickness of the printed circuit board varies. Therefore, in the conventional conveyor 1, the gap between two clamping rails of the clamping rail member 2 is adjustable in accordance with the thickness of the printed circuit board. To speak more specifically, the gap between the clamping rails is directly changed by a conventional reciprocating drive device 4 such as a pneumatic cylinder or an electromagnetic cylinder according to the thickness of the printed circuit board. Such drive device 4 is not a multipoint control unit so that the gap between the clamping rails can be simply changed in one single state. Accordingly, in the case of too small gap, the printed circuit board with a different thickness may be damaged due to excessively great clamping force. On the other hand, in the case of too large gap, the printed circuit board may loosen due to insufficient clamping force. Therefore, the conventional linear drive device can be hardly reliably used to adjust the gap between the clamping rails.

SUMMARY OF THE INVENTION

It is therefore a primary object of the present invention to provide a clamping mechanism, which is automatically adaptable to change of thickness of printed circuit board so as to firmly and reliably hold the printed circuit board.

It is a further object of the present invention to provide the above clamping mechanism in which the adjustment range of the clamping gap can be enlarged in adaptation to larger change of thickness of the printed circuit board to be held.

To achieve the above and other objects, the clamping mechanism automatically adaptable to change of thickness of printed circuit board of the present invention includes: a frame body including two horizontal elongated bar-like rail seats in parallel to each other; two clamping rail members respectively mounted on the rail seats for clamping and holding two opposite sides of a printed circuit board, each of the clamping rail members including a first straight elongated clamping rail and a second straight elongated clamping rail, the first and second clamping rails being horizontally mounted on the rail seat along the length thereof in parallel to each other, the second clamping rail being positioned above the first clamping rail, a top rail face of the first clamping rail being spaced from a bottom rail face of the second clamping rail by a certain clamping gap for clamping a corresponding side of the printed circuit board; and two adjustment units respectively disposed on opposite outer sides of the rail seats for adjusting the clamping gap of the clamping rail members. The clamping mechanism is characterized in that each of the adjustment units includes a support section, a connection section and a floating section. The support section is fixedly mounted on the frame body to provide a support face for the floating section. One end of the connection section is fixedly connected with the corresponding first clamping rail. The other end of the connection section is positioned above the support face. The floating section is positioned between the connection section and the support section and supported on the support face to apply a resilient support force to the connection section. Via the connection section, the floating section serves to resiliently drive the first clamping rail to float up and down within a certain range and change the height of the first clamping rail. Accordingly, the clamping gap between the first and second clamping rails can be adjusted.

The present invention can be best understood through the following description and accompanying drawings, wherein:

DETAILED DESCRIPTION OF THE PREFERRED EMBODIMENT

Figure 1:
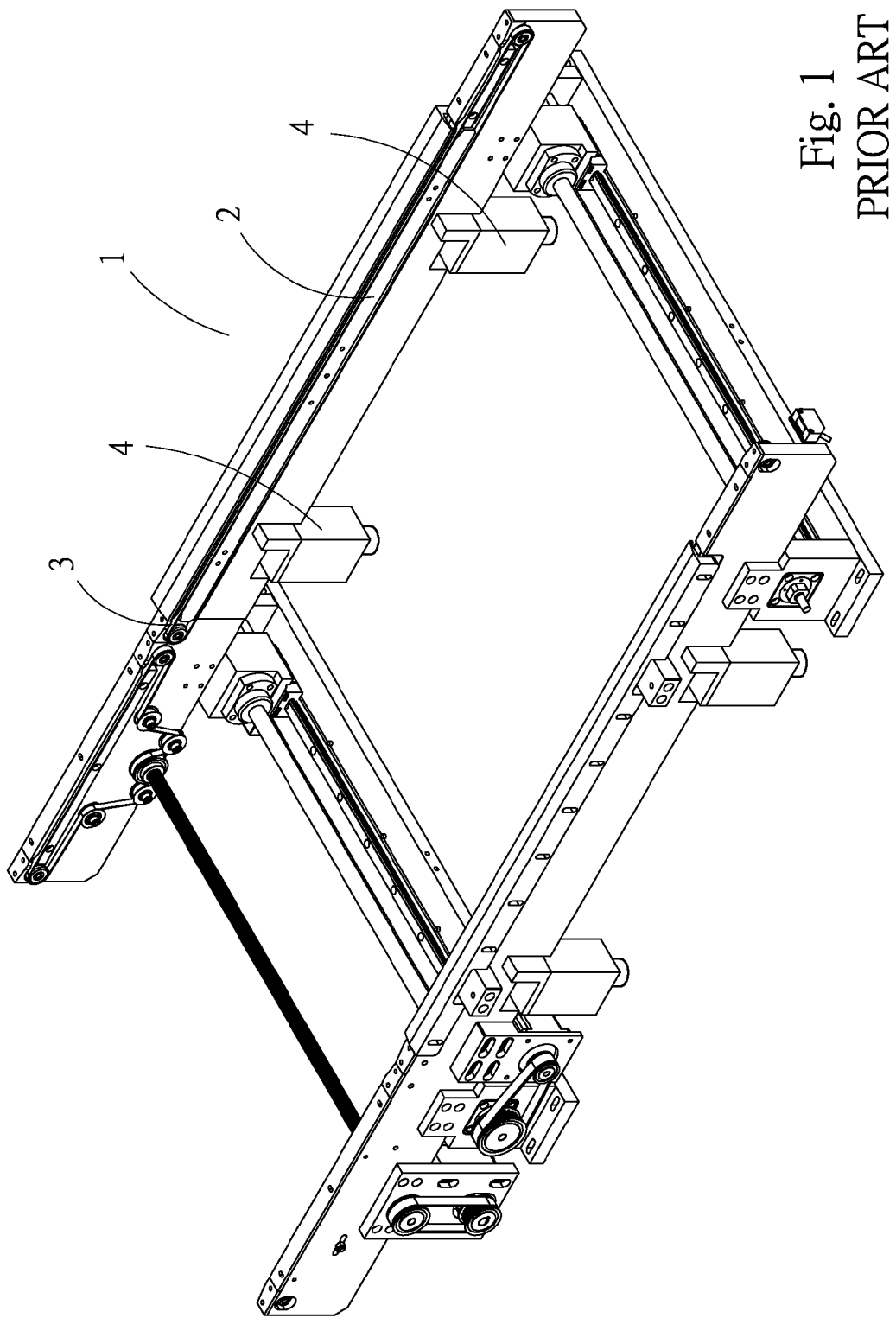
FIG. 1 is a perspective assembled view of a conventional PCB conveyor.
Figure 2:
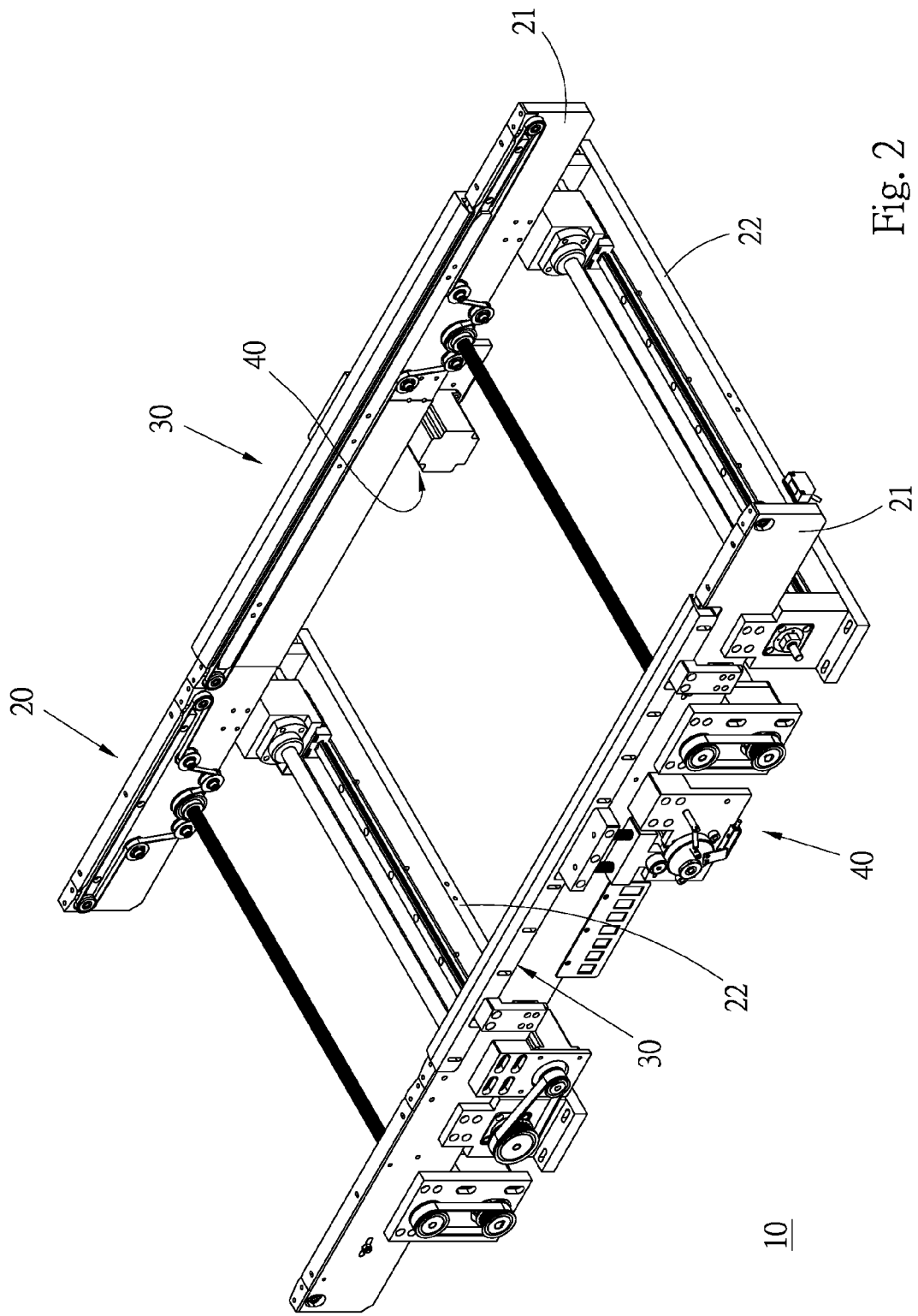
FIG. 2 is a perspective assembled view of a preferred embodiment of the present invention.
Figure 3:
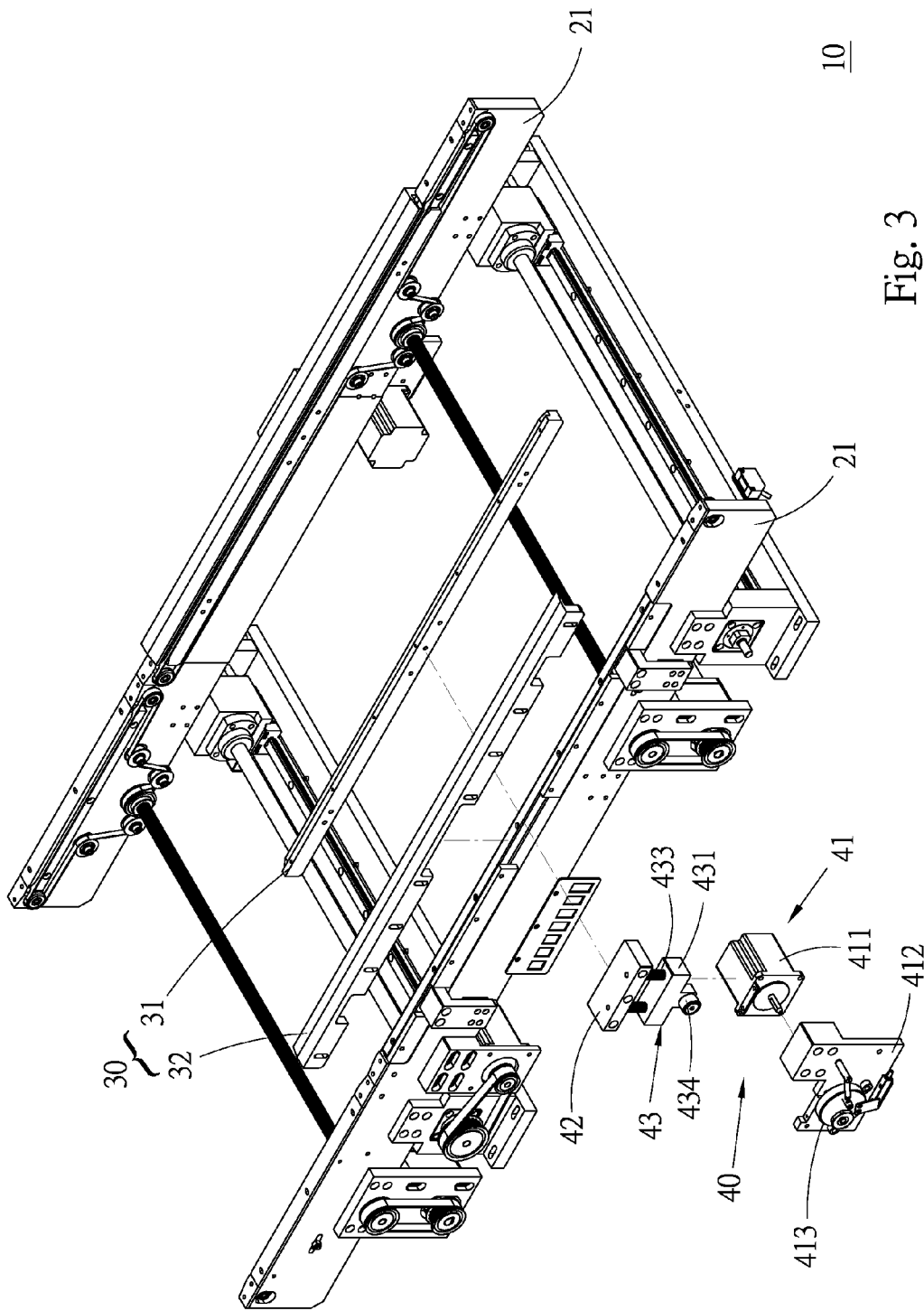
FIG. 3 is a perspective partially exploded view of the preferred embodiment of the present invention.
Figure 4:
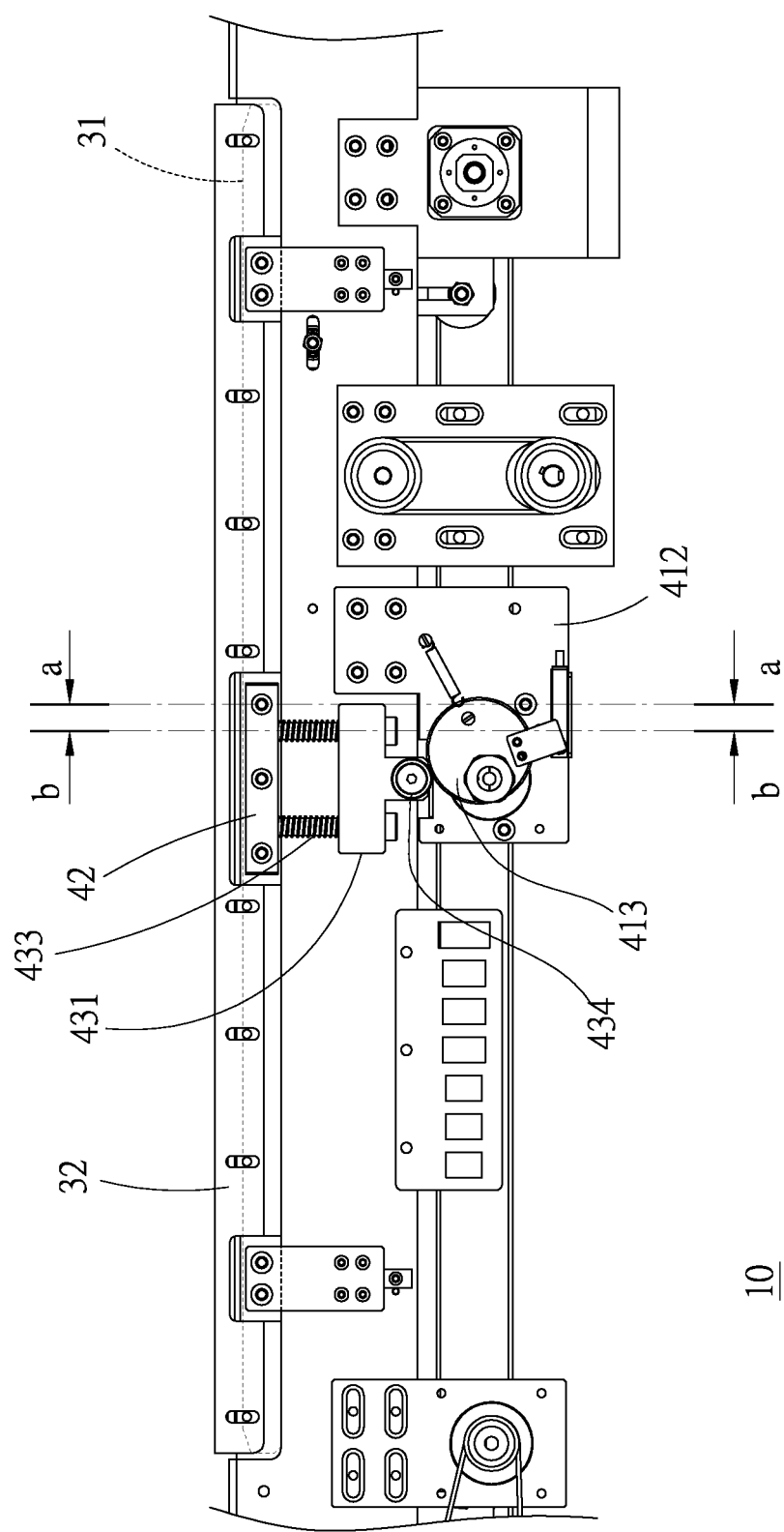
FIG. 4 is a side view of the preferred embodiment of the present invention.
Figure 5:
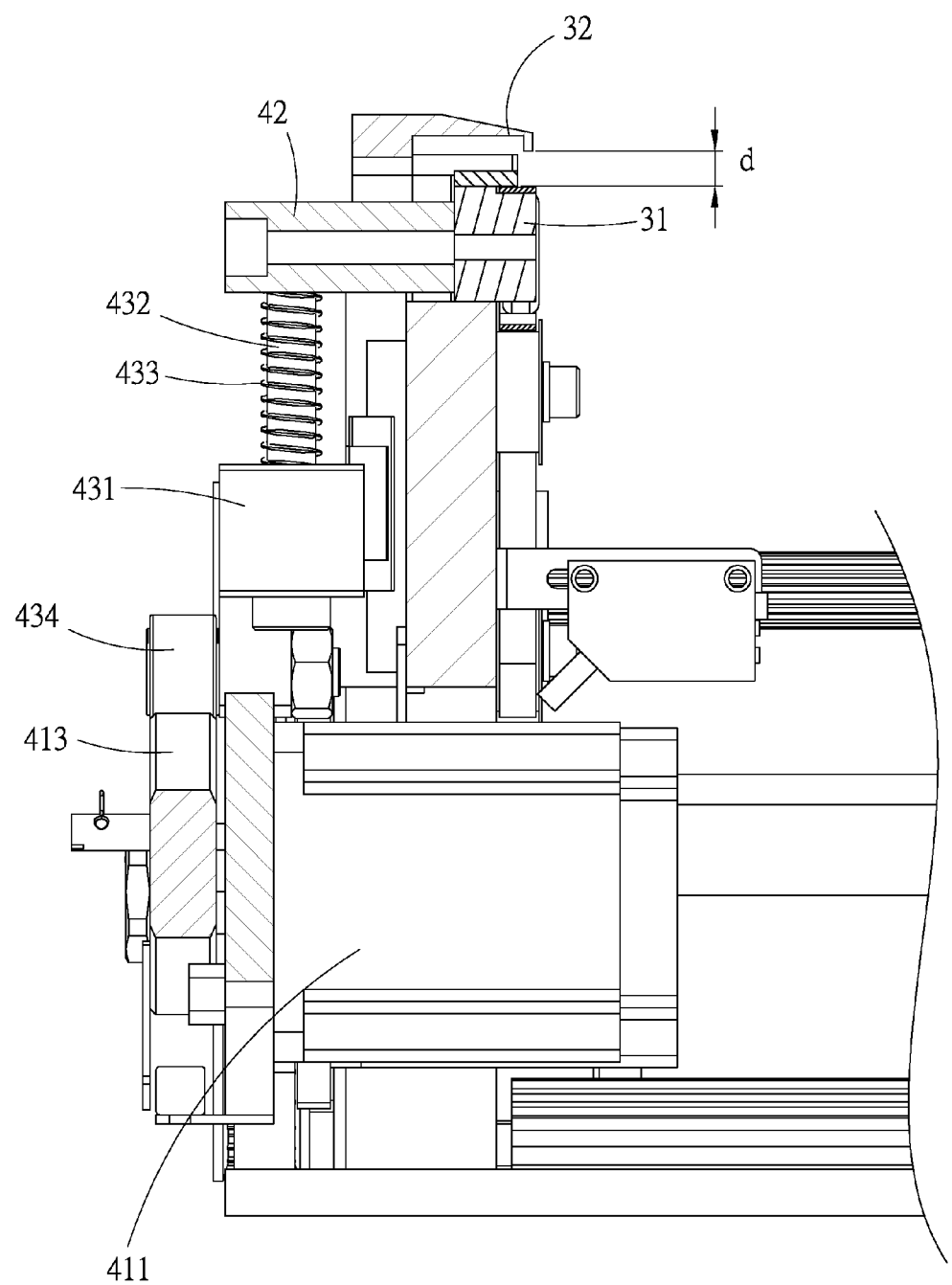
FIG. 5 is a sectional view taken along line a-a of FIG. 4.
Figure 6:
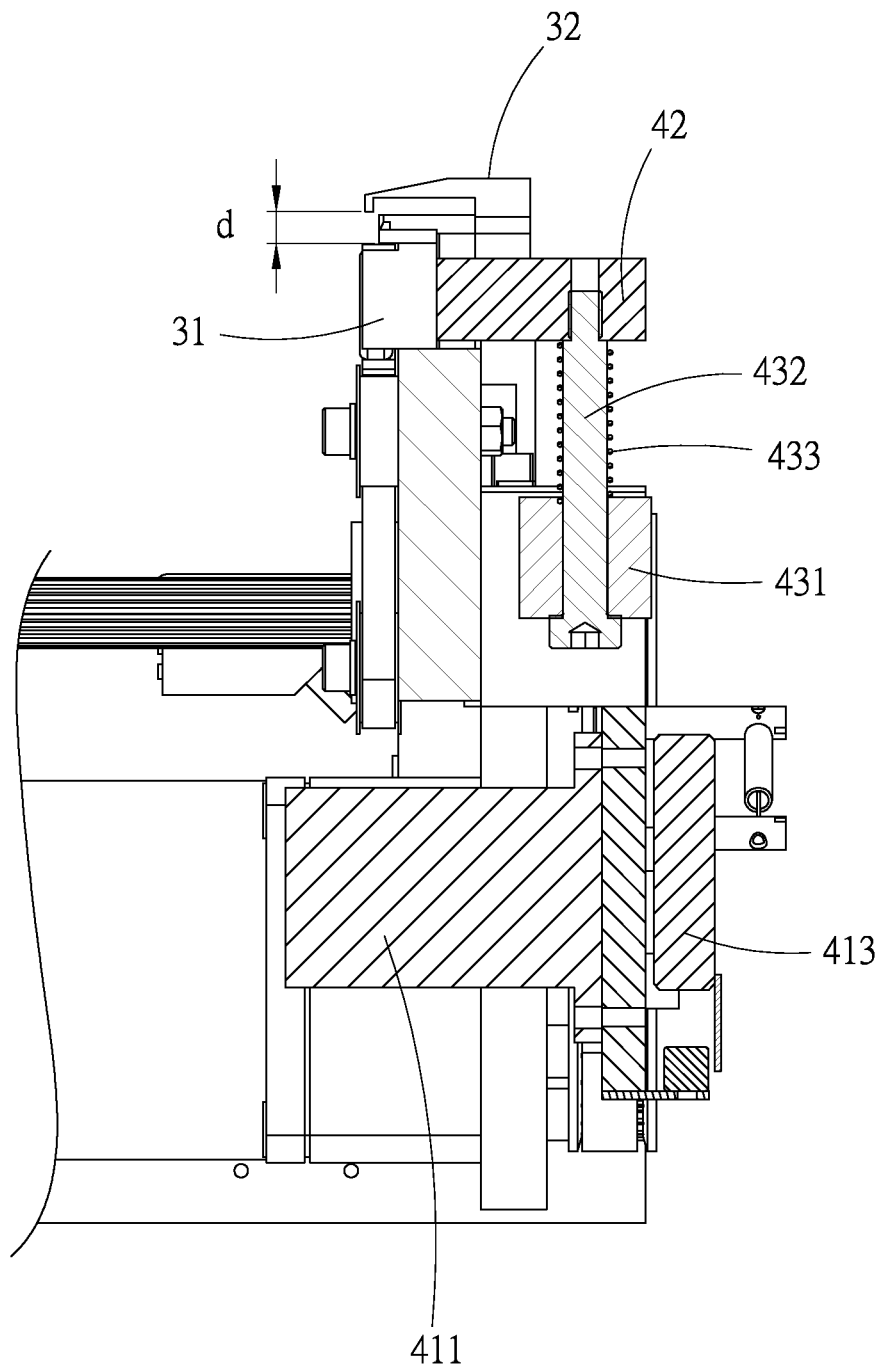
FIG. 6 is a sectional view taken along line b-b of FIG. 4.

Please refer to FIGS. 2 to 6. According to a preferred embodiment of the present invention, the clamping mechanism 10 automatically adaptable to change of thickness of printed circuit board mainly includes a frame body 20, two clamping rail members 30 and two adjustment units 40.

The frame body 20 includes two horizontal elongated bar-like rail seats 21 in parallel to each other. The other components of the clamping mechanism 10 are arranged on the rail seats 21. Two locating bottom boards 22 are bridged between the rail seats 21 in parallel to each other for fixing the rail seats 21 in their true positions and reinforcing the frame body 20.

The clamping rail members 30 are respectively mounted on the rail seats 21 for clamping and holding two opposite sides of a printed circuit board and locating the same. By means of a conventional transmission mechanism, the held printed circuit board is moved along the length of the rail seats 21. This technique pertains to prior art and thus will not be further described hereinafter. Each clamping rail member 30 includes a first straight elongated clamping rail 31 and a second straight elongated clamping rail 32. The first and second clamping rails 31, 32 are horizontally mounted on the corresponding rail seat 21 along the length thereof in parallel to each other. The second clamping rail 32 is positioned above the first clamping rail 31 and fixedly connected to a top edge of the corresponding rail seat 21. The first clamping rail 31 is positioned on an inner side of the corresponding rail seat 21. A top rail face of the first clamping rail 31 is spaced from a bottom rail face of the second clamping rail 32 by a certain clamping gap d.

The adjustment units 40 are respectively disposed on opposite outer sides of the rail seats 21 for adjusting the clamping gap d of the clamping rail members 30. Substantially, each adjustment unit 40 includes a support section 41, a connection section 42 and a floating section 43.

The connection section 42 is a block body positioned across the corresponding rail seat 21 in a recess 211 of upper edge of the rail seat 21. That is, one end of the connection section 42 extends from the outer side of the rail seat 21 through the recess to attach to and connect with one side of the corresponding first clamping rail 31.

The support section 41 has a motor 411 fixedly mounted at the bottom edge of the corresponding rail seat 21 via an end board 412. The support section 41 further has a support wheel 413 eccentrically fixedly coupled with an output shaft of the motor 411.

The floating section 43 has a floating block 431 positioned between the connection section 42 and the support wheel 413. The floating section 43 further has two connection pillars 432 each having a top end and a bottom end. The top ends of the connection pillars 432 are fixedly connected to the connection section 42. The bottom ends of the connection pillars 432 pass through the floating block 431, whereby the floating block 431 can be guided by the connection pillars 432 to linearly reciprocally move relative to the connection section 42. Two compression springs 433 are respectively fitted around the connection pillars 432 between the floating block 431 and the connection section 42. First ends and second ends of the compression springs 433 respectively abut against the floating block 431 and the connection section 42 to apply a resilient force to the floating block 431 in a direction away from the connection section 42. A floating wheel 434 is mounted at a bottom end of the floating block 431 via a shaft. The circumference of the floating wheel 434 is in rolling contact with the circumference of the support wheel 413.

Accordingly, the top of the circumference of the support wheel 413 serves as a support face for the floating section 43. By means of the resilient force of the springs 433, the floating section 43 can resiliently keep the connection section 42 at a certain height. Under such circumstance, the first clamping rail 31, which is connected with the connection section 42, is kept in a certain position where the first clamping rail 31 is spaced from the second clamping rail 32 by the clamping gap d. In the case that the clamping gap d is smaller than the thickness of the printed circuit board to be clamped, the printed circuit board will exert a depression force upon the first clamping rail 31. Since the first clamping rail 31 is resiliently supported by the floating section 43, the first clamping rail 31 can be resiliently up and down floated within a certain range. Accordingly, when the printed circuit board exerts the depression force upon the first clamping rail 31, the first clamping rail 31 is moved downward away from the adjacent second clamping rail 32. Accordingly, the clamping gap d is enlarged in adaptation to the larger thickness of the printed circuit board for reliably clamping and holding the printed circuit board.

Moreover, the support face of the support section 41 for the floating section 43 is adjustable so that the adjustment range of the clamping gap d can be enlarged. That is, the support wheel 413 can be driven by the motor 411 to eccentrically rotate, whereby the top of the circumference of the support wheel 413 that serves as the support face for the floating wheel 434 is positioned at a different height. In this case, the floating wheel 434 will be supported at a different height to change the height and position of the floating section 43. Accordingly, the adjustment range of the clamping gap d is enlarged in adaptation to larger change of thickness of the printed circuit board to be held.

The above embodiment is only used to illustrate the present invention, not intended to limit the scope thereof. Many modifications of the above embodiment can be made without departing from the spirit of the present invention.

What is claimed is:

1. A clamping mechanism automatically adaptable to change of thickness of printed circuit board, comprising:
    a frame body including two horizontal elongated bar-like rail seats in parallel to each other;
    two clamping rail members respectively mounted on the rail seats for clamping and holding two opposite sides of a printed circuit board, each of the clamping rail members including a first straight elongated clamping rail and a second straight elongated clamping rail, the first and second clamping rails being horizontally mounted on the rail seat along the length thereof in parallel to each other, the second clamping rail being positioned above the first clamping rail, a top rail face of the first clamping rail being spaced from a bottom rail face of the second clamping rail by a certain clamping gap for clamping a corresponding side of the printed circuit board; and
    two adjustment units respectively disposed on opposite outer sides of the rail seats for adjusting the clamping gap of the clamping rail members, the clamping mechanism being characterized in that each of the adjustment units includes a support section, a connection section and a floating section, the support section being fixedly mounted on the frame body to provide a support face for the floating section, one end of the connection section being fixedly connected with the corresponding first clamping rail, the other end of the connection section being positioned above the support face, the floating section being positioned between the connection section and the support section and supported on the support face to apply a resilient support force to the connection section, via the connection section, the floating section serving to resiliently drive the first clamping rail to float up and down within a certain range and change the height of the first clamping rail, whereby the clamping gap between the first and second clamping rails can be adjusted;
    wherein each support section has a support wheel positioned under the floating section, a top of the circumference of the support wheel serving as the support face for supporting the floating section.

2. The clamping mechanism automatically adaptable to change of thickness of printed circuit board as claimed in claim 1, wherein the each support section further includes a motor fixedly mounted on the frame body, the support wheel being eccentrically fixedly coupled with an output shaft of the motor, whereby the support wheel can be driven to eccentrically rotate so as to change the height of the support face.

3. The clamping mechanism automatically adaptable to change of thickness of printed circuit board as claimed in claim 1, wherein each floating section has a floating wheel, the circumference of the floating wheel being in rolling contact with the circumference of the support wheel.

4. A clamping mechanism automatically adaptable to change of thickness of printed circuit board, comprising:
   a frame body including two horizontal elongated bar-like rail seats in parallel to each other;
   two clamping rail members respectively mounted on the rail seats for clamping and holding two opposite sides of a printed circuit board, each of the clamping rail members including a first straight elongated clamping rail and a second straight elongated clamping rail, the first and second clamping rails being horizontally mounted on the rail seat along the length thereof in parallel to each other, the second clamping rail being positioned above the first clamping rail, a top rail face of the first clamping rail being spaced from a bottom rail face of the second clamping rail by a certain clamping gap for clamping a corresponding side of the printed circuit board; and
   two adjustment units respectively disposed on opposite outer sides of the rail seats for adjusting the clamping gap of the clamping rail members, the clamping mechanism being characterized in that each of the adjustment units includes a support section, a connection section and a floating section, the support section being fixedly mounted on the frame body to provide a support face for the floating section, one end of the connection section being fixedly connected with the corresponding first clamping rail, the other end of the connection section being positioned above the support face, the floating section being positioned between the connection section and the support section and supported on the support face to apply a resilient support force to the connection section, via the connection section, the floating section serving to resiliently drive the first clamping rail to float up and down within a certain range and change the height of the first clamping rail, whereby the clamping gap between the first and second clamping rails can be adjusted;
   wherein each floating section has a floating block, at least one spring being disposed between the floating block and the connection section, two ends of the spring respectively abutting against the floating block and the connection section to apply a resilient force to support the connection section;
   wherein each support section has a support wheel positioned under the floating section, a top of the circumference of the support wheel serving as the support face for supporting the floating section.

5. The clamping mechanism automatically adaptable to change of thickness of printed circuit board as claimed in claim 4, wherein the each support section further includes a motor fixedly mounted on the frame body, the support wheel being eccentrically fixedly coupled with an output shaft of the motor, whereby the support wheel can be driven to eccentrically rotate so as to change the height of the support face.

6. The clamping mechanism automatically adaptable to change of thickness of printed circuit board as claimed in claim 4, wherein each floating section has a floating wheel, the circumference of the floating wheel being in rolling contact with the circumference of the support wheel.

7. A clamping mechanism automatically adaptable to change of thickness of printed circuit board, comprising:
   a frame body including two horizontal elongated bar-like rail seats in parallel to each other;
   two clamping rail members respectively mounted on the rail seats for clamping and holding two opposite sides of a printed circuit board, each of the clamping rail members including a first straight elongated clamping rail and a second straight elongated clamping rail, the first and second clamping rails being horizontally mounted on the rail seat along the length thereof in parallel to each other, the second clamping rail being positioned above the first clamping rail, a top rail face of the first clamping rail being spaced from a bottom rail face of the second clamping rail by a certain clamping gap for clamping a corresponding side of the printed circuit board; and
   two adjustment units respectively disposed on opposite outer sides of the rail seats for adjusting the clamping gap of the clamping rail members, the clamping mechanism being characterized in that each of the adjustment units includes a support section, a connection section and a floating section, the support section being fixedly mounted on the frame body to provide a support face for the floating section, one end of the connection section being fixedly connected with the corresponding first clamping rail, the other end of the connection section being positioned above the support face, the floating section being positioned between the connection section and the support section and supported on the support face to apply a resilient support force to the connection section, via the connection section, the floating section serving to resiliently drive the first clamping rail to float up and down within a certain range and change the height of the first clamping rail, whereby the clamping gap between the first and second clamping rails can be adjusted;
   wherein each floating section has a floating block, at least one spring being disposed between the floating block and the connection section, two ends of the spring respectively abutting against the floating block and the connection section to apply a resilient force to support the connection section;
   wherein the floating section includes at least one connection pillar, one end of the connection pillar being fixedly connected to the connection section, the other end of the connection pillar being slidably connected with the floating block, the spring being fitted around a middle section of the connection pillar;
   wherein each support section has a support wheel positioned under the floating section, a top of the circumference of the support wheel serving as the support face for supporting the floating section.

8. The clamping mechanism automatically adaptable to change of thickness of printed circuit board as claimed in claim 7, wherein the each support section further includes a motor fixedly mounted on the frame body, the support wheel being eccentrically fixedly coupled with an output shaft of the motor, whereby the support wheel can be driven to eccentrically rotate so as to change the height of the support face.

9. The clamping mechanism automatically adaptable to change of thickness of printed circuit board as claimed in claim 7, wherein each floating section has a floating wheel, the circumference of the floating wheel being in rolling contact with the circumference of the support wheel.

* * * * *